United States Patent
Park

[19]

[11] Patent Number: 5,949,841
[45] Date of Patent: Sep. 7, 1999

[54] FREQUENCY GAIN DISPLAY APPARATUS FOR L/C BAND FREQUENCY UP UNIT

[75] Inventor: Yong-Seon Park, Seoul, Rep. of Korea

[73] Assignee: Hyundai Electronics Ind. Co., Ltd., Rep. of Korea

[21] Appl. No.: 09/019,974

[22] Filed: Feb. 6, 1998

[30] Foreign Application Priority Data

Feb. 6, 1997 [KR] Rep. of Korea .......................... 97-3722

[51] Int. Cl.$^6$ .................................................. H03K 21/00
[52] U.S. Cl. .............................. 377/33; 377/28; 377/109; 327/47; 327/48; 327/113; 327/117; 327/119; 327/179
[58] Field of Search ................................ 377/33, 109, 28; 327/113, 117, 119, 47, 48, 179

[56] References Cited

U.S. PATENT DOCUMENTS

| | | | |
|---|---|---|---|
| 4,379,271 | 4/1983 | Lehmann | 331/49 |
| 5,802,463 | 9/1998 | Zuckerman | 455/208 |

*Primary Examiner*—Margaret R. Wambach
*Attorney, Agent, or Firm*—Lawrence G. Kurland

[57] ABSTRACT

A frequency gain display apparatus for an L/C band frequency up unit which is capable of generating a pulse for adjusting the gain of an L/C band frequency up unit used in a satellite system and a pulse for selecting a band width of a SAW (surface acoustic wave) filter and is capable of displaying a gain step of the same. The apparatus includes a gain setting unit for setting an up/down state of the frequency gain, a monostable oscillator for oscillating a positive pulse in a frequency gain up/down state, first and second error prevention units for inverting positive pulses from the monostable oscillators and preventing a counting error of a decimal counter, with the decimal counter counting negative pulses from the first and second error prevention units and outputting a BCD code corresponding to the frequency gain, decoders for converting the BCD code from the decimal counter into a signal for displaying the frequency gain, and a display unit for receiving driving signals from the decoders and displaying a frequency gain up/down step in response thereto.

8 Claims, 3 Drawing Sheets

FREQUENCY GAIN DISPLAY APPARATUS FOR L/C BAND FREQUENCY UP UNIT

BACKGROUND OF THE INVENTION

1. Field of the Invention

The present invention relates to a frequency gain display apparatus for an L/C band frequency up unit, and in particular, to an improved frequency gain display apparatus for an L/C band frequency up unit which is capable of generating a pulse for a adjusting the gain of an L/C band frequency up unit used in a satellite system and a pulse for selecting a band width of a SAW (surface acoustic wave) filter and is capable of displaying a gain step of the same.

2. Description of the Prior Art

Generally, the L/C band up unit of a global star satellite is directed by use of a variable gain of 34~66 dB by a PIN diode.

Such a prior art L/C band frequency up unit uses a gain up/down pulse and controls the gain from the minimum 34 dB gains to the maximum 66 dB gains by 1 dB through 32 steps.

However, in order to control the width of the up/down pulse for controlling the gain of the L/C band frequency up unit, an expensive pulse generator is required. In addition, in order to adjust the gain of the L/C band up unit, since the gain steps are not known, an additional display apparatus must be used for checking the gain steps, which increases the fabrication cost of the system is increased.

SUMMARY OF THE INVENTION

Accordingly, it is an object of the present invention to provide an improved frequency gain display apparatus for an L/C band frequency up unit which overcomes the aforementioned problems encountered in the prior art.

It is another object of the present invention to provide an improved frequency gain display apparatus for an L/C band frequency up unit which is capable of generating a pulse for adjusting the gain of an L/C band frequency up unit used in a satellite system and a pulse for selecting a band width of a SAW (surface acoustic wave) filter and is capable of displaying a gain step of the same.

In order to achieve the above objects, there is provided a frequency gain display apparatus for an L/C band frequency up unit which includes a gain setting unit for setting an up/down state of a frequency gain, a monostable oscillator for oscillating a positive pulse in a frequency gain up/down state, first and second error prevention units for inverting positive pulses from the monostable oscillators and preventing a counting error of with the decimal counter, a decimal counter counting negative pulses from the first and second error prevention units and outputting a BCD code corresponding to the frequency gain, decoders for converting the BCD code from the decimal counter into a signal for displaying the frequency gain, and a display unit for receiving driving signals from the decoders for being driven and displaying a frequency gain up/down step.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
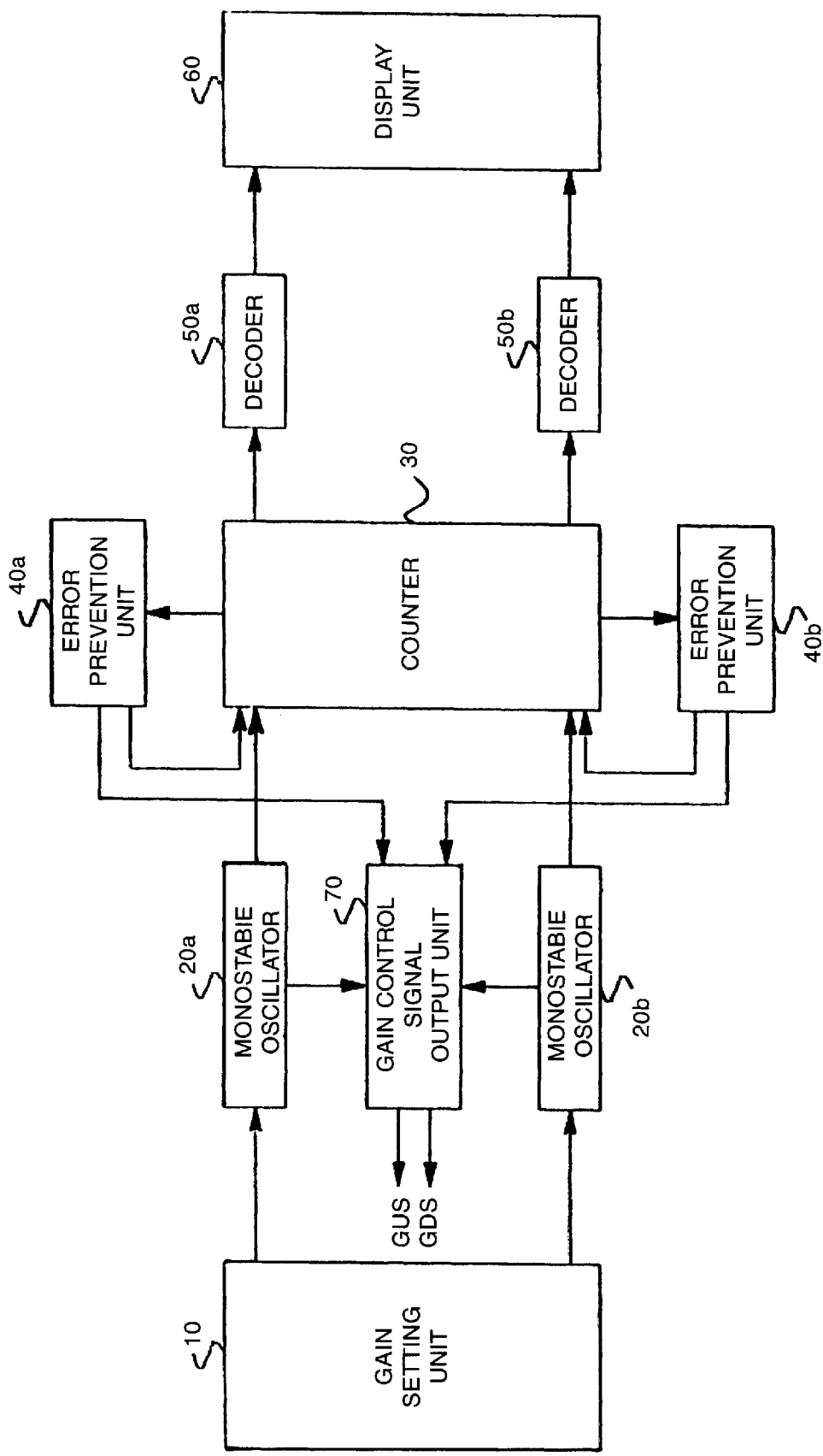
FIG. 1 is a block diagram illustrating a frequency gain display apparatus for an L/C band frequency up unit according to the present invention.

Referring now to the drawings in detail, the construction and operation of the frequency gain display apparatus for an L/C band frequency up unit according to the present invention will now be explained in greater detail with reference to FIGS. 1–3.

FIG. 1 is a block diagram illustrating a frequency gain display apparatus for an L/C band frequency up unit according to the present invention. As shown therein, the frequency gain display apparatus for an L/C band frequency up unit according to the present invention includes a gain setting unit 10 for setting an up/down state of the frequency gain, monostable oscillators 20a and 20b for oscillating a positive pulse with respect to the frequency gain up/down state, error prevention units 40a and 40b connected to a decimal counter 30 for inverting the position pulses of the monostable oscillators 20a and 20b and preventing a counting error of the decimal counter 30 which is connected to the monostable oscillators 20a and 20b, a with the decimal counter 30 counting the negative pulses from the error prevention units 40a and 40b and outputting a BCD code corresponding to the frequency gain, decoders 50a and 50b for converting the BCD code from the decimal counter 30 into a signal for displaying the frequency gain, and a display unit 60 for receiving the driving signals from the decoders 50a and 50b and displaying the frequency gain up/down steps.

Figure 2:
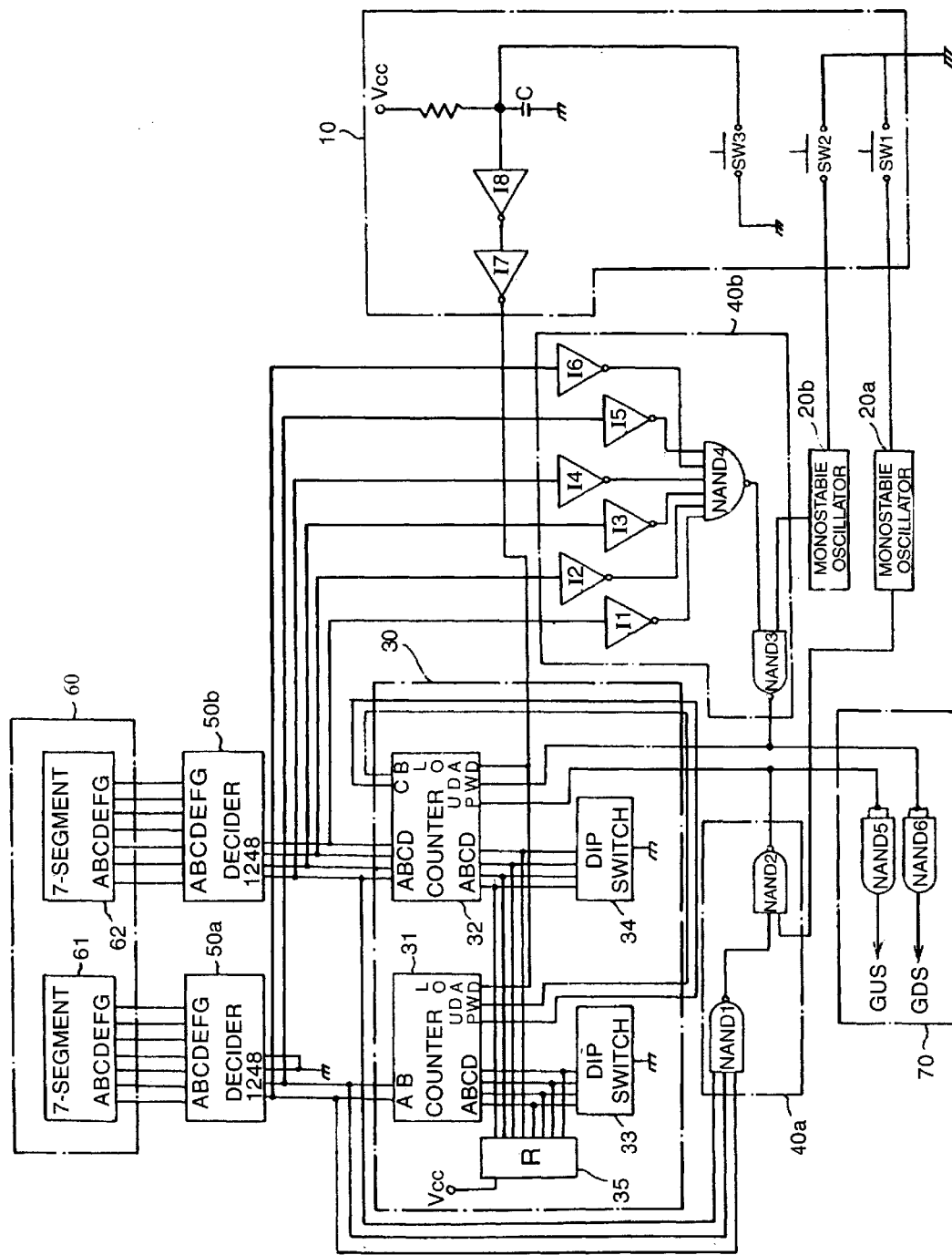
FIG. 2 is a detailed schematic diagram of the apparatus of FIG. 1.

As shown in FIG. 2, the decimal counter 30 which counts the frequency gain steps includes a pair of decimal counters 31 and 32 for counting upper digits and lower digits, respectively, and dip switches 33 and 34 for setting the upper gain into the counting values of the decimal counters 31 and 32 when loading.

In addition, as further shown in FIG. 2, the error prevention unit 40a includes a NAND-gate NAND1 for NANDing the output signals A and B from the decimal counter 31 and the output signal A from the decimal counter 32, and a NAND-gate NAND2 for NANDing the output signals from the NAND-gate NAND1 and the monostable oscillator 20a. The error prevention unit 40b includes inverters I1 through I6 for inverting the output signals A and B from the decimal counter 31 and the output signals A, B, C and D from the decimal counter 32, a NAND-gate NAND4 for NANDing the output signals from the inverters I1 through I6, and a NAND-gate NAND3 for NANDing the output signal from the NAND-gate NAND4 and the output signal from the monostable oscillator 20b.

In addition, as also shown in FIG. 2, the clock pulses from the error prevention units 40a and 40b are outputted as a gain control signal for controlling the frequency gain of the L/C frequency up unit to be up or down by the gain control signal output unit 70.

Next, the operation of the present invention will now be explained with reference to FIGS. 2 and 3.

When the up switch SW1 or the down switch SW2 for controlling an up or down operation with respect to the gains of the L/C band frequency up unit and the SAW filter is closed, a positive pulse is generated by the respective monostable oscillator 20a or 20b and is supplied to the NAND-gates NAND2 and NAND3, respectively.

The NAND-gate NAND2, to which the positive pulse is inputted from the monostable oscillator 20a, inverts the positive pulse, and the supplies the inverted pulse to the input terminal of the NAND-gate NAND5.

The decimal counter 32 counts the lower digits of the increasing frequency gain steps, and the decimal counter 31 counts the output signals from the decimal counter 32 and counts the upper digits of the frequency gain steps and outputs to the decoders 50a and 50b, respectively.

Here, the input signal levels are set to 31 (0,0,+5,+5. 0,0,0,+5) by operating the dip switches 33 and 34 connected with the input terminals A, B, C and D of the decimal counters 31 and 32. Therefore, when operating the load switch SW3, the decimal counters 32 and 31 loads "31".

Since the NAND-gate NAND1 NANDs the output signals A and B from the decimal counter 31 and the output signal A from the decimal counter 32 and supplies to the input terminal of the NAND-gate NAND2, it is possible to prevent the gain steps above "31(0011.0001).

Thereafter, the decoders 50a and 50b which receive the BCD code from two decimal counters 31 and 32 convert the BCD code into the signals for displaying the frequency gains steps of the L/C band frequency up unit and the SAW filter and supplies these signals to the 7-segments 61 and 62 of the display unit 60.

Thus, the decoders 50a and 50b convert the BCD code into the driving signal which is capable of displaying the gain state of the L/C band frequency up unit and the SAW filter for measuring the frequency based on the gains steps in accordance with the control of the controller.

The 7-segments 61 and 62 are driven in accordance with the control signals from the decoders 50a and 50b, so that it is possible to check the gain states of the L/C band frequency up unit or the SAW filter for measuring the frequency characteristic based on each gain by the controller.

In addition, the NAND-gate NAND5 for receiving the negative pulse from the NAND-gate NAND2 inverts the negative pulse, and supplies a gain up signal (GUS) to the controller for measuring the frequency characteristic of the L/C band frequency up unit (not shown).

Figure 3:
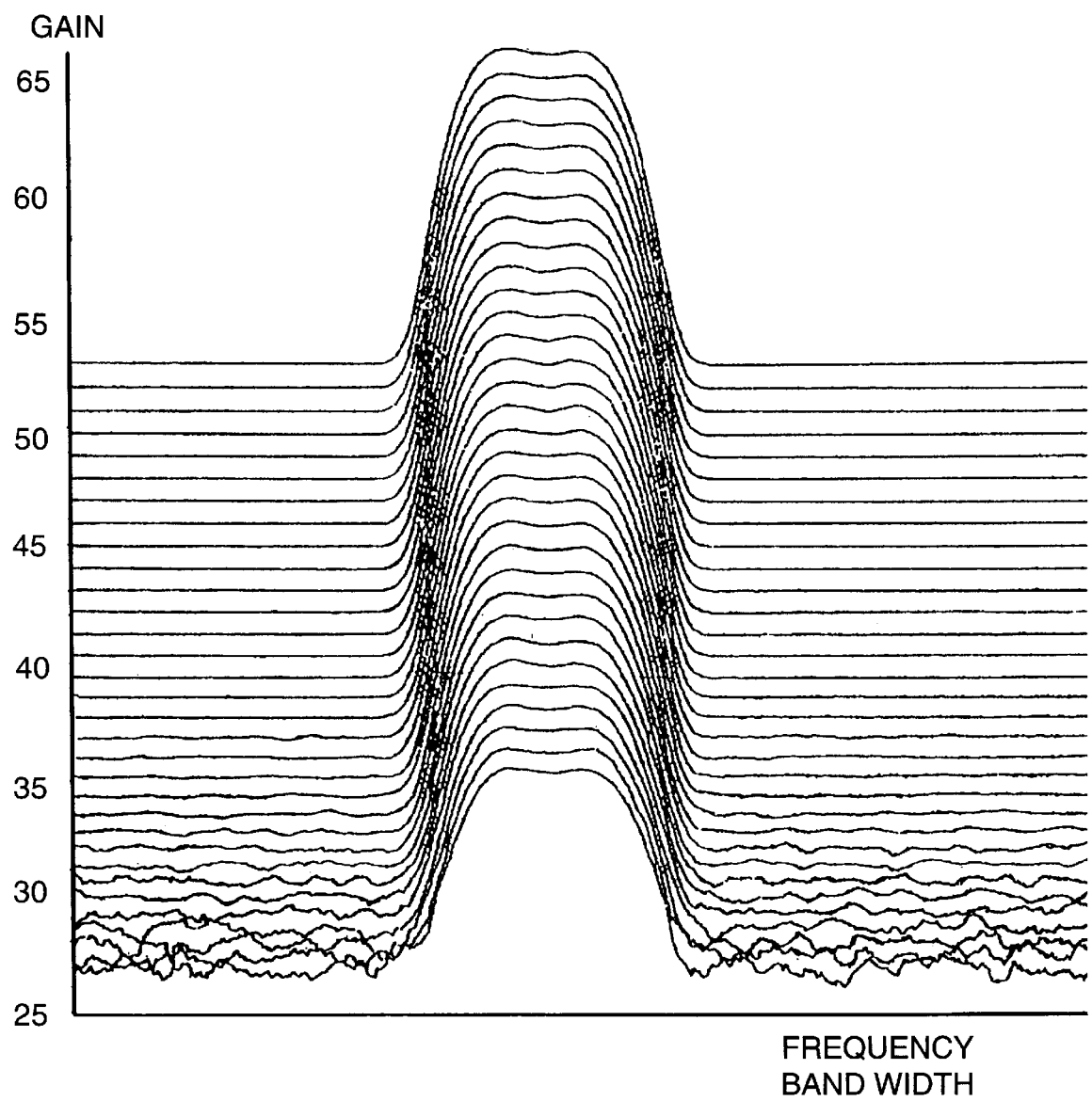
FIG. 3 is a graphical illustration of a frequency gain state of an LC band frequency up unit according to the present invention.

Therefore, the frequency gain of the L/C band frequency up unit is controlled in accordance with the control by the controller which receives the gain up signal, thus obtaining the frequency characteristic shown in the graphical illustration of FIG. 3.

The NAND-gate NAND3 which receives the positive pulse outputted from the monostable oscillator 20b inverts the positive pulse, and supplies it to the input terminal DW of the counter 32 and the input terminal of the NAND-gage NAND6, respectively.

The decimal counter 32 counts the lower digits of the decreasing frequency gain step, and the decimal counter 31 counts the output signals from the decimal counter 32 and the upper digits of the frequency gain step and the resulting signals are then supplied to the decoders 50a and 50b, respectively.

The NAND-gate NAND4 NANDs the output signals A and B from the decimal counter 31 inverted by the inverters I1 through I6 and the output signals A, B, C and D from the decimal counter 32, so that it is possible to prevent the counting of the gain steps below "00(0000.0000)".

Thereafter, the decoders 50a and 50b which receive the BCD codes from two decimal counters 31 and 32, convert the BCD codes into the signals for indicating the frequency gains steps of the L/C band frequency up unit and the SAW filter and supply these signals to the 7-segments 61 and 62 of the display unit 60.

Thus, the decoders 50a and 50b convert the BCD codes into the driving signals for displaying the gain state of the L/C band frequency up unit and the SAW filter for measuring the frequency based on the gain step in accordance with the control of the controller.

The 7-segments 61 and 62 are driven by the control signals from the decoders 50a and 50b, so that it is possible to check the gain state of the L/C band frequency up unit or the SAW filter for measuring the frequency characteristic based on each gain by the gain state in accordance with the operation of the up switch SW1, namely, by the controller.

In addition, the NAND-gate NAND6 which receives the negative pulse from the NAND-gate NAND3, inverts the negative pulse, and supplies the gain down signal (GDS) to the controller for measuring the frequency characteristic of the L/C band frequency up unit. Therefore, the frequency gain of the L/C band frequency up unit is controlled in accordance with the control of the controller which receives the gain down signal, so that it is possible to obtain the frequency characteristic shown in the graphical illustration of FIG. 3.

As described above, in the frequency gain displaying apparatus for an L/C band frequency up unit according to the present invention, the gain up and gain down signals are generated in accordance with the switch operation for increasing and decreasing the frequency gain of the L/C band frequency up unit or the SAW filter and the thusly, generated signals are supplied to the L/C band frequency up unit and the SAW filter. In addition, it is possible to accurately control the frequency gains of the L/C band frequency up unit or the SAW filter by indicating the up/down state of the frequency gain. Furthermore, it is possible to check the frequency gain state by measuring the frequency characteristic.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A frequency gain displaying apparatus for an L/C band frequency up unit, comprising:

a gain setting means for setting a frequency gain up/down state, said gain setting means having an output;

a monostable oscillator means for oscillating a positive pulse in said frequency gain up/down state, said monostable oscillator means having an input and an output with said input being operatively connected to said gain setting means output; a decimal counter means, said decimal counter means having an input operatively connected to said monostable oscillator means output;

error prevention means operatively connected to said monostable oscillator means and said counter means for inverting positive pulses from said monostable oscillator means and preventing a counting error of said decimal counter means;

said decimal counter means comprising means for counting negative pulses from the error prevention means and outputting a BCD code corresponding to the frequency gain;

decoder means operatively connected to said counter means for converting the BCD code from the decimal counter means into a signal for displaying the frequency gain; and display means operatively connected to said decoder means for receiving driving signals from the decoder means and displaying a frequency gain up/down step in response thereto.

2. The apparatus of claim 1, wherein said decimal counter means comprises:

sub decimal counters for counting an upper digit and a lower digit; said subdecimal counters having associated settable counting values; and dip switches for setting the upper gain when loading the settable counting values of the sub-decimal counters.

3. The apparatus of claim 1, wherein said decimal counter means comprises first and second decimal counters and said error prevention means comprises first and second error prevention means, said first error prevention means comprising:

a first NAND-gate for NANDing an output signal from said first decimal counter and an output signal from said second decimal counter; and a second NAND-gate for NANDing output signals from the first NAND-gate and the monostable oscillator means.

4. The apparatus of claim 3, wherein said second error prevention means comprises:

inverters for inverting output signals from the first decimal counter and output signals from the second decimal counter;

a fourth NAND-gate for NANDing output signals from the inverters; and a third NAND-gate for NANDing an output from the fourth NAND-gate and an output from the monostable oscillator means.

5. The apparatus of claim 1, further comprising a gain control signal output means operatively connected to said error prevention means for outputting clock signals from the error prevention means as a gain control signal for increasing or decreasing said frequency gain of the L/C band frequency up unit.

6. The apparatus of claim 1 wherein said decimal counter means comprises first and second decimal counters and said error prevention means comprises first and second error prevention means, said second error prevention means comprising:

inverters for inverting output signals from the first decimal counter and output signals from the second decimal counter;

a fourth NAND-gate for NANDing output signals from the inverters; and a third NAND-gate for NANDing an output from the fourth NAND-gate and an output from the monostable oscillator means.

7. The apparatus of claim 6 further comprising a gain control signal output means operatively connected to said first and second error preventions means for outputting clock signals from the first and second error prevention means as a gain control signal for increasing or decreasing said frequency gain of the L/C band frequency output.

8. The apparatus of claim 3 further comprising a gain control signal output means operatively connected to said first and second error preventions means for outputting clock signals from the first and second error prevention means as a gain control signal for increasing or decreasing said frequency gain of the L/C band frequency output.

* * * * *